United States Patent
Pascal et al.

(10) Patent No.: US 10,901,004 B2
(45) Date of Patent: Jan. 26, 2021

(54) HIGH-VOLTAGE MEASURING UNIT WITH SELF-CORRECTION

(71) Applicant: ABB Schweiz AG, Baden (CH)

(72) Inventors: Joris Pascal, Basel (CH); Richard Bloch, Nussbaumen (CH)

(73) Assignee: ABB Schweiz AG, Baden (CH)

( * ) Notice: Subject to any disclaimer, the term of this patent is extended or adjusted under 35 U.S.C. 154(b) by 541 days.

(21) Appl. No.: 15/710,243

(22) Filed: Sep. 20, 2017

(65) Prior Publication Data

US 2018/0011128 A1 Jan. 11, 2018

Related U.S. Application Data (63) Continuation of application No. PCT/EP2016/056022, filed on Mar. 18, 2016.

(30) Foreign Application Priority Data

Mar. 20, 2015 (EP) .................................... 15160084

(51) Int. Cl.
G01R 15/04 (2006.01)
G01R 35/00 (2006.01)
G01R 19/00 (2006.01)

(52) U.S. Cl.
CPC ......... *G01R 15/04* (2013.01); *G01R 19/0084* (2013.01); *G01R 35/005* (2013.01)

(58) Field of Classification Search
CPC ............ G01R 19/0007; G01R 19/0084; G01R 19/2513; G01R 19/2503; G01R 19/32;

(Continued)

(56) References Cited

U.S. PATENT DOCUMENTS 6,278,952 B1 * 8/2001 Swain .................. G01R 35/005
702/64
7,173,429 B2 * 2/2007 Kutkut ............... G01R 31/3648
324/431

(Continued)

FOREIGN PATENT DOCUMENTS

CN 1307240 A 8/2001
CN 101535818 A 9/2013

(Continued)

OTHER PUBLICATIONS

European Patent Office, International Search Report & Written Opinion issued in corresponding Application No. PCT/EP2016/056022, dated Jun. 30, 2016, 12 pp.

(Continued)

*Primary Examiner* — Huy Q Phan
*Assistant Examiner* — Dustin R Dickinson
(74) *Attorney, Agent, or Firm* — Taft Stettinius & Hollister LLP; J. Bruce Schelkopf (57) ABSTRACT

The present application relates to a method for providing a corrected measuring signal indicating a high voltage on a high-voltage node (HV), including: injecting a periodic injection signal into a voltage divider coupled between the high-voltage node (HV) and a reference potential; obtaining a sensing signal at a sensing node (S) of the voltage divider, wherein the sensing signal depends on the periodic injection signal; from the sensing signal, separating a first sensing signal portion resulting from the high voltage and a second sensing signal portion resulting from the periodic injection signal; and depending on the second sensing signal portion, correcting the first sensing signal portion corresponding to the high-voltage signal in order to obtain the corrected measuring signal.

17 Claims, 5 Drawing Sheets

(58) Field of Classification Search
CPC ........ G01R 15/04; G01R 15/06; G01R 15/16; G01R 5/005
See application file for complete search history.

(56) References Cited

U.S. PATENT DOCUMENTS

| | | | | |
|---|---|---|---|---|
| 2003/0164714 | A1* | 9/2003 | Ghassemi | G01R 15/06 324/658 |
| 2005/0248351 | A1 | 11/2005 | Graf | |
| 2010/0225304 | A1 | 9/2010 | Wynne | |
| 2011/0184675 | A1* | 7/2011 | White | G01R 15/146 702/61 |
| 2013/0154672 | A1* | 6/2013 | Fabregas | G01R 35/005 324/713 |
| 2013/0335730 | A1 | 12/2013 | Shan et al. | |
| 2014/0300335 | A1* | 10/2014 | Labbe | H02M 3/156 323/282 |
| 2015/0061627 | A1* | 3/2015 | Iwata | H01L 27/088 323/282 |
| 2015/0280557 | A1* | 10/2015 | Xue | H02M 3/157 323/271 |

FOREIGN PATENT DOCUMENTS

| | | |
|---|---|---|
| CN | 103323641 A | 9/2013 |
| CN | 103460604 A | 12/2013 |
| DE | 102010061838 A1 | 5/2012 |
| JP | H06-130089 A | 5/1994 |
| WO | 2012069307 A1 | 5/2012 |

OTHER PUBLICATIONS

Ohinese Office Action dated Jul. 3, 2019 in Chinese Application No. 201680029062.2 (18 pages).

* cited by examiner

HIGH-VOLTAGE MEASURING UNIT WITH SELF-CORRECTION

TECHNICAL FIELD

The present invention relates to high-voltage measuring units, in particular to measuring units for measuring high AC or DC voltages using a voltage divider. Furthermore, the present invention relates to methods for increasing the accuracy of high-voltage measuring units.

TECHNICAL BACKGROUND

Voltage measuring units to be applied in high-voltage power systems commonly apply resistive or capacitive voltage dividers. When applying a voltage divider for measuring the high voltage, a precisely known attenuation factor needs to be preset. Such a voltage divider is usually configured with a series connection of two dipoles, wherein the upper dipole is connected to the voltage line carrying the voltage to be measured and a lower dipole is connected to a ground potential. In order to achieve a desired attenuation of around 70 dB to 100 dB, the upper dipole has a significantly higher impedance than the lower dipole. The impedance of the upper dipole is high so that the connection to the voltage line can be considered as galvanically insulated, which is essential for application in HV power systems as high voltages to be measured in HV power systems may have voltages of several tens of kV. For instance, impedances of the upper dipole of about 300 MΙ may be applied in order to limit the current flowing through the voltage divider to a few tens of ∝A.

Manufacturing tolerances of the impedances of the dipoles as well as aging effects may lead to varying attenuation of the voltage divider. Furthermore, temperature variations may also affect the impedances of the dipole so that measurement errors may occur.

US 20130335730A1 discloses a temperature compensation for an optical current or voltage sensor. The signal to be measured is obtained from a resitive voltage devider. A reference signal generator provides a periodic square wave reference signal which is added to the signal obtained from the voltage divider by means of a summing integrator.

JP061 30089 A 1 discloses an electro-optical voltage sensor with a temperature compensation by means of a reference voltage. The signal to be measured is obtained from a capacitive voltage divider.

It is therefore an object of the present invention to provide a means for compensating for the above effects of aging, temperature variations and manufacturing tolerances in order to facilitate a more accurate measurement of the high voltage on the high-voltage line.

SUMMARY OF THE INVENTION

The above object is achieved by the method for providing a corrected measuring signal indicating a high voltage on a high-voltage node according to claim 1 as well as by the measuring unit and the high-voltage measurement system according to the further independent claims.

Further embodiments are indicated in the dependent subclaims.

According to a first aspect, a method for providing a corrected measuring signal indicating a high voltage on a high-voltage node is provided, comprising the steps of:

injecting a periodic injection signal into a voltage divider coupled between the high-voltage node and a reference potential;

obtaining a sensing signal at a sensing node of the voltage divider wherein the sensing signal depends on the periodic injection signal;

from the sensing signal, separating a first sensing signal portion resulting from the high voltage and a second sensing signal portion resulting from the injection signal; and depending on the second sensing signal portion, correcting the first sensing signal portion corresponding to the high-voltage signal in order to obtain the corrected measuring signal wherein correcting the first sensing signal portion includes providing a correction signal, wherein the correction signal is applied on the first sensing signal portion, wherein the correction signal is obtained depending on the second sensing signal portion, wherein the periodic injection signal is provided by an injection signal source, wherein the correction signal is obtained depending on a difference signal between the injection signal exposed to an attenuation, which corresponds to an attenuation of the voltage divider, and the second sensing signal portion.

One idea of the above method for providing a corrected measuring signal is to correct a sensing signal tapped on a sensing node of a voltage divider by means of a periodic injection signal. The voltage divider may have a first and second dipole providing an impedance ratio for a high attenuation of the high voltage with respect to the sensing node. The injection signal is injected into the voltage divider as a periodic AC injection signal, which causes a current to flow through the voltage divider to the low impedance high-voltage node. The injection signal having a specific periodicity results in a sensing signal on the sensing node. The sensing signal is an overlaid signal of the signal resulting from the voltage division of the high voltage which corresponds to the first sensing signal portion, and the injecting of the injection signal which corresponds to the second sensing signal portion. So the sensing signal substantially depends on the impedances of the first and the second dipole of the voltage divider.

By means of the specific frequency/-ies of the injection signal, the second sensing signal portion of the divider voltage at the sensing node related to the injection signal can be extracted or respectively separated from the sensing signal at the sensing node. Hence, the injected voltage signal strongly depends on the impedance ratio of the dipoles. As for high-voltage measurement the voltage divider has a first dipole with much higher impedance than the second dipole, the sensing signal strongly depends on a variation of the impedance of the first dipole. In case of a variation of the impedance of the first dipole, the voltage level of the second sensing signal portion caused by the injection signal will vary accordingly.

As the second sensing signal portion at the sensing node will also vary according to the variation of the impedance of the first dipole, a correction value can be determined which can be applied on the first sensing signal portion to correct for the variability of the high impedance of the first dipole of the voltage divider.

The above method has the advantage that impedance variations of the first dipole caused by manufacturing tolerances, temperature changes and aging effects can be compensated for in order to provide a corrected measuring signal which is substantially independent of variations of the high impedance of the first dipole.

Furthermore, the correction allows the use of general-purpose elements for implementing the voltage divider, thereby saving costs for high-accuracy material and manufacturing as measurement errors can be reliably corrected.

Furthermore, no manual calibration is required with the application of the above measurement method. As the correction can be permanently or periodically carried out on the sensing signal at the sensing node without substantially affecting the first sensing signal portion, no maintenance is required during the lifetime of the measurement system in order to ensure the expected accuracy.

Furthermore, correcting the first sensing signal portion may include providing a correction signal, wherein the correction signal is applied on the first sensing signal portion of the sensing signal.

It may be provided that the periodic injection signal is injected into a compensation voltage divider of a compensation unit, which compensation voltage divider is coupled between the injection signal source and the reference potential.

According to an embodiment, a compensation signal provided by the compensation voltage divider of the compensation unit is fed to an input of a subtraction unit or of a differential amplifier, and the second sensing signal portion provided by the correction unit is fed to another input of the subtraction unit or of the differential amplifier.

According to an embodiment, the injection signal may be provided with a square waveform, wherein the difference signal has a square waveform the amplitude of which is associated to the correction signal.

Moreover, the correction signal may correspond to a digital correction value to be applied on the first sensing signal portion, particularly by multiplication.

The injection signal may be provided with a frequency which is different from the frequency of the high voltage, wherein separating the second sensing signal portion from the sensing signal is carried out by applying a digital or analog second filtering on the sensing signal.

Furthermore, separating the first sensing signal portion from the sensing signal may be carried out by applying a digital or analog first filtering on the sensing signal.

It may be provided that correcting the first sensing signal portion includes associating the correction signal to the second sensing signal portion According to a further aspect, a measuring unit for providing a corrected measuring signal indicating a high voltage on a high-voltage node is provided, comprising:
  an injection unit for injecting a periodic injection signal into a voltage divider coupled between the high-voltage node and a reference potential; and
  a correction unit which is configured
    to receive a sensing signal from a sensing node of the voltage divider depending on the injection signal;
    to separate a first sensing signal portion resulting from the high voltage and a second sensing signal portion resulting from the injection signal; and
    to correct the first sensing signal portion corresponding to the high-voltage signal in order to obtain the corrected measuring signal depending on the second sensing signal portion
  a compensation unit configured to provide a compensation signal which is related to the periodic injection signal and which is for eliminating variations of the second sensing signal portion due to temperature variations and
  wherein the injection unit comprises an injection source for supplying the periodic injection signal.

It may be provided that the compensation unit comprises a compensation voltage divider, and wherein the injection unit injects the periodic injection signal into the voltage divider coupled between the injection unit and the reference potential.

The compensation voltage divider my have the same impedance ratio as the voltage divider.

The compensation signal provided by the compensation voltage divider of the compensation unit may be supplied to an input of a subtraction unit or to an input of a differential amplifier, and the second sensing signal portion provided by the correction unit may be supplied to another input of the subtraction unit or of the differential amplifier.

It may be provided that the output of the subtraction unit or the output of the differential amplifier is associated with a correction value and may be fed to a multiplier and may there be multiplied with the first sensing signal portion to correct variations of the portion of the sensing signal.

Moreover, the injection unit may include a current mirror or a transformer for injecting a reference signal into the voltage divider as an injection signal.

The correction unit may include a first filter unit and/or a second filter unit configured to separate the first sensing signal portion and the second sensing signal portion from the sensing signal.

It may be provided that the injection unit comprises an injection source for supplying the injection signal, wherein a compensation unit is configured to provide a compensation signal referring to the injection signal and to eliminate variations of the second sensing signal portion due to temperature variations by applying the compensation signal.

According to a further aspect, a measurement system for providing a corrected measuring signal indicating a high voltage on a high-voltage node is provided, comprising:
  a voltage divider having a first dipole and a second dipole serially connected between the high-voltage node and a reference potential and providing an intermediate sensing node; and
  the above measuring unit.

BRIEF DESCRIPTION OF THE DRAWINGS

Embodiments are described in more detail in conjunction with the accompanying drawings, in which.

DESCRIPTION OF EMBODIMENTS

Figure 1:
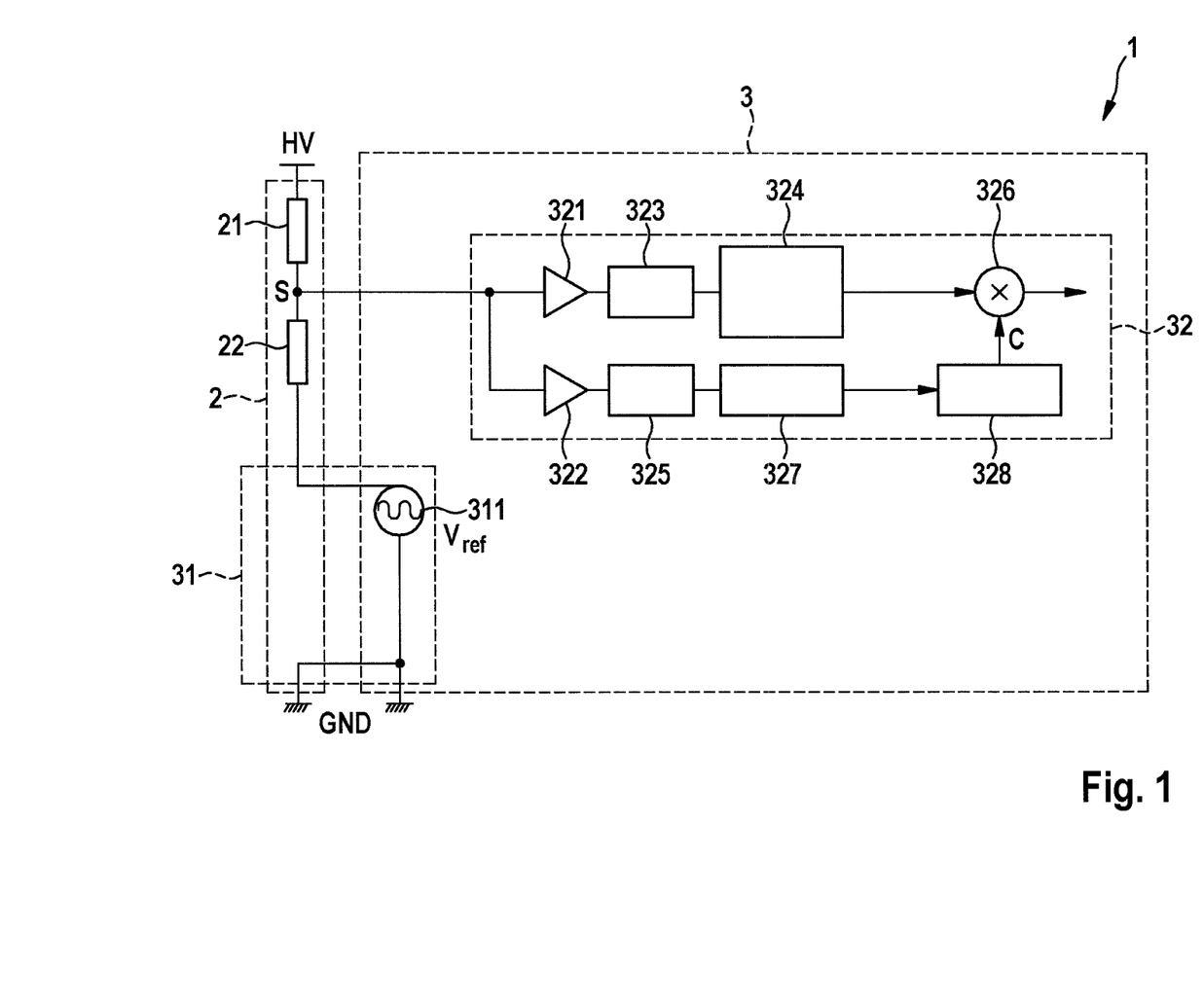
FIG. 1 schematically shows the high-voltage measurement system.

FIG. 1 shows a schematic diagram of a high-voltage measurement system 1 having a voltage divider 2 which is coupled between a high-voltage node HV, the voltage of which is to be measured, and a reference potential, such as a ground potential GND. The high voltage node HV may carry a DC or AC high voltage. The high-voltage measurement system 1 serves for measuring a high voltage at the high-voltage node HV and for providing sufficient galvanic insulation of the high-voltage node HV through the high-voltage measurement system 1.

The voltage divider 2 has a first dipole 21 and a second dipole 22 which are connected in series between the high-voltage node HV and the ground potential GND, wherein a sensing node S located between the first dipole 21 and the second dipole 22 is used to tap a sensing signal. To provide a high attenuation of 60 dB to 100 dB for the high voltage at the high-voltage node HV, the first dipole 21 is provided with a high impedance while the second dipole 22 has a substantially lower impedance. To achieve galvanic insulation with respect to the high-voltage node HV, the impedance of the first dipole 21 may be selected to be very high, such as higher than 100 MΩ, for instance 300 MΩ. The impedance of the second dipole 22, which is connected between the sensing node S and the ground potential GND, may be as low as several tens of kΩ, such as 30 kΩ.

In the above example of 300 MΩ and 30 kΩ as impedances, an attenuation of about 70 dB can be achieved. Applying high impedances for the first dipole 21 allows for substantial galvanic insulation of the sensing node S from the high-voltage node HV.

The sensing node S is coupled with a measuring unit 3 to measure a sensing voltage at the sensing node S as an indication of the voltage level of the high-voltage node HV.

Figure 2A:
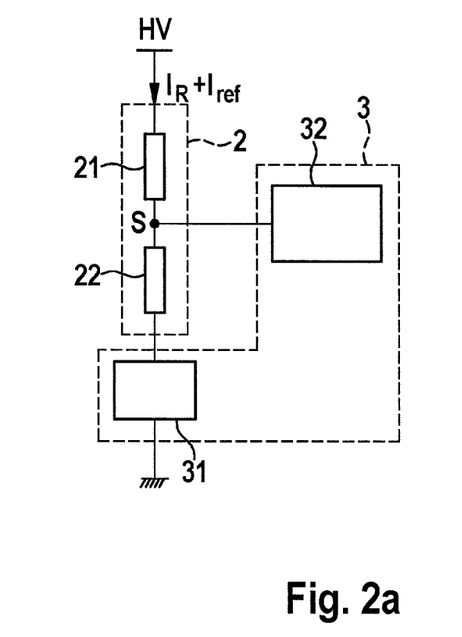
FIGS. 2a-2c indicate a variance for positioning the signal injection element.
Figure 2B:
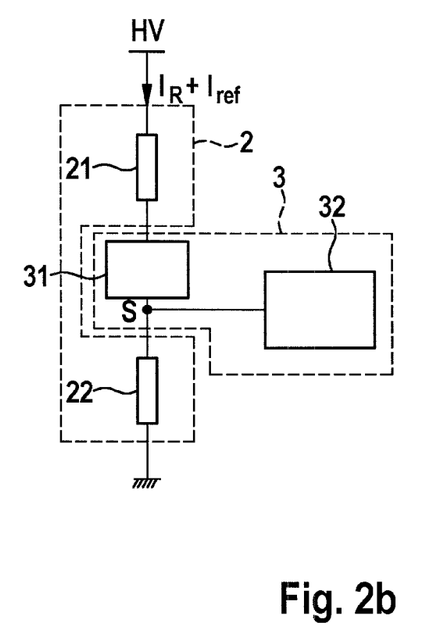
Figure 2C:
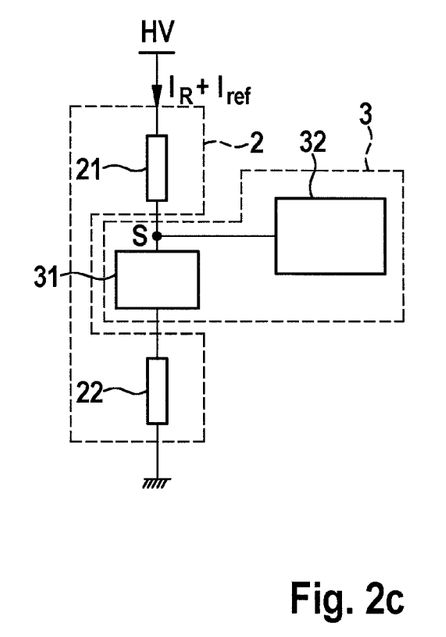

The measuring unit 3 includes an injection unit 31 which serves to inject an injection signal into the current path of the voltage divider 2. The injection unit 31 can be applied in the current path of the voltage divider 2 at different positions so that an injection current $I_{ref}$ flows through the current path. For instance, the injection unit 31 may be applied at a position between the second dipole 22 and the ground potential GND as shown in FIG. 2a, between the first dipole 21 and the sensing node S as shown in FIG. 2b, or between the sensing node S and the second dipole 22 as shown in FIG. 2c. In general the injection unit 31 is not directly coupled to the high voltage node HV but so that at least the first dipole 21 is between the high voltage node HV and the injection unit 31.

The injection unit 31 can include an injection signal source 311 which outputs an injection voltage signal $V_{ref}$. The injection signal source 311 may be connected in series with the voltage divider 2. The injection signal source 311 may have a low impedance, and provide the injection signal which can be a periodic voltage signal Vref of predetermined frequency/-ies and waveform(s). In case the high voltage at the high-voltage node HV is an AC voltage, the frequency or periodicity, respectively, of the injection signal is to be selected to differ therefrom.

Figure 3A:
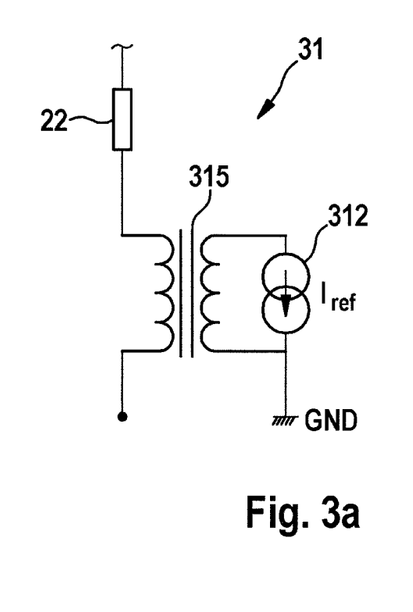
FIGS. 3a-3b show options for injecting the injection signal as an injection current by means of a current source.

FIGS. 3a and 3b show alternative configurations for injecting the injection signal. FIG. 3a shows an injection by means of a transformer 315, the primary side of which is coupled in series to the voltage divider 2 and the secondary side of which is coupled to a current source 312. The current source 312 applies the injection signal to be injected into the voltage divider 2.

Figure 3B:
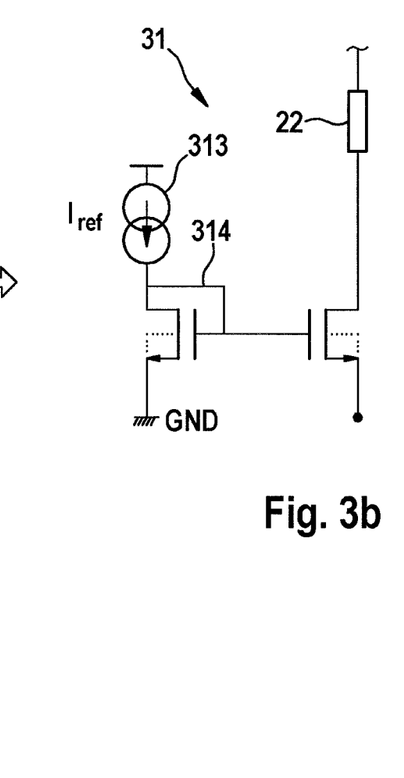

As shown in FIG. 3b, a current mirror including two transistors 314 (interconnected at their gates) is applied for injecting a current injection signal provided by the injection current source 313 into a first side (first transistor 314) of the current mirror so that the injection current is introduced into the voltage divider 2 by its second side (second transistor 314).

Back to FIG. 1, the measuring unit 3 further includes a correction unit 32 which is connected to the sensing node S. The correction unit 32 comprises a first gain stage 321 and a second gain stage 322, both coupled with their inputs to the sensing node S. The gain stages 321, 322 have different gains to appropriately amplify the sensing signal to obtain an amplified signal in which the signal variations due to the impedance drift of the first dipole 21 can be detected. The first gain stage 321 serves for receiving the sensing signal at the sensing node S, amplifies it and outputs the amplified sensing signal to a first AD converter 323 which converts the voltage of the applied sensing signal. Following the first AD converter 323, a first digital filter unit 324 is applied for separating a first sensing signal portion from the sensing signal at the sensing node S. In case the high voltage is an AC voltage, the first digital filter unit 324 may selectively extract the frequency portion of the frequency of the high voltage at the high-voltage node HV and harmonics thereof. The first digital filter unit 324 may include a DFT unit to act as a digital filter. The first digital filter unit 324 extracts the signal portion related to the frequency of the high voltage at the high-voltage node HV and its harmonics, which represents the HV sensor signal.

Alternatively, instead of the first AD converter 323 and the first digital filter unit 324 a first analog filter can be applied upstream of the first gain stage 321 to selectively let the relevant voltage portions pass through.

The output of the first digital filter unit 324 is applied to a multiplier 326 for digitally multiplying the digital value of the HV sensor signal.

The second gain stage 322 is connected with its output to a second AD converter 325 which forwards the digitalized and amplified sensor signal to a second digital filter unit 327. The second digital filter unit 327 may correspond to a high pass, band pass or low pass filter and is configured to extract (a digital representation of) a second sensing signal portion from the overlaid voltage of the sensing signal which has the same frequency as the injection signal but excludes the first sensing signal portion. Hence, the first and second digital filter units 324, 327 serve for selectively extracting a respective sensing signal portion from the sensing signal, i.e. the HV sensor signal and the injected voltage signal, which refer to the high voltage and the injection signal, respectively.

In case the high voltage is a DC voltage, the first filter unit 324 can be omitted or formed as a low pass filter having a base frequency lower than the (lowest) frequency of the injection signal.

The first and/or the second filter unit 324, 327 may include a DFT (Discrete Fourier Transformation) logic coupled with a selector to selectively extract one or a sum of amplitude values at one or more specific frequency portions of the sensing signal at the sensing node S. The output of the second filter unit 327 is forwarded to a control logic 328 which has included a predetermined function or predetermined look-up table or the like and associates to the output value of the second filter unit 327 a correction value C which is then fed to the multiplier 326. The value of the first sensing signal portion, which is related to the high voltage to be measured at the high-voltage node HV, namely the one or the sum of amplitude values of the one or more specific frequency portions of the sensing signal, is thus multiplied with the correction value C to correct for variations of the portion of the sensing signal which is related to variations of the impedance of the first dipole 21. Instead of multiplying the correction value C can be applied on the first sensing signal portion by adding or any other appropriate operation. Accordingly, the association of the correction value C to the output value of the second filter unit 327 is implemented such that any variations of the sensing signal due to a variation of the impedance of the first dipole 21 are compensated. The control logic 328 causes the injection signal source 311 to output an injection voltage signal $V_{ref}f$ which is assumed to be temperature-independent.

Figure 4:
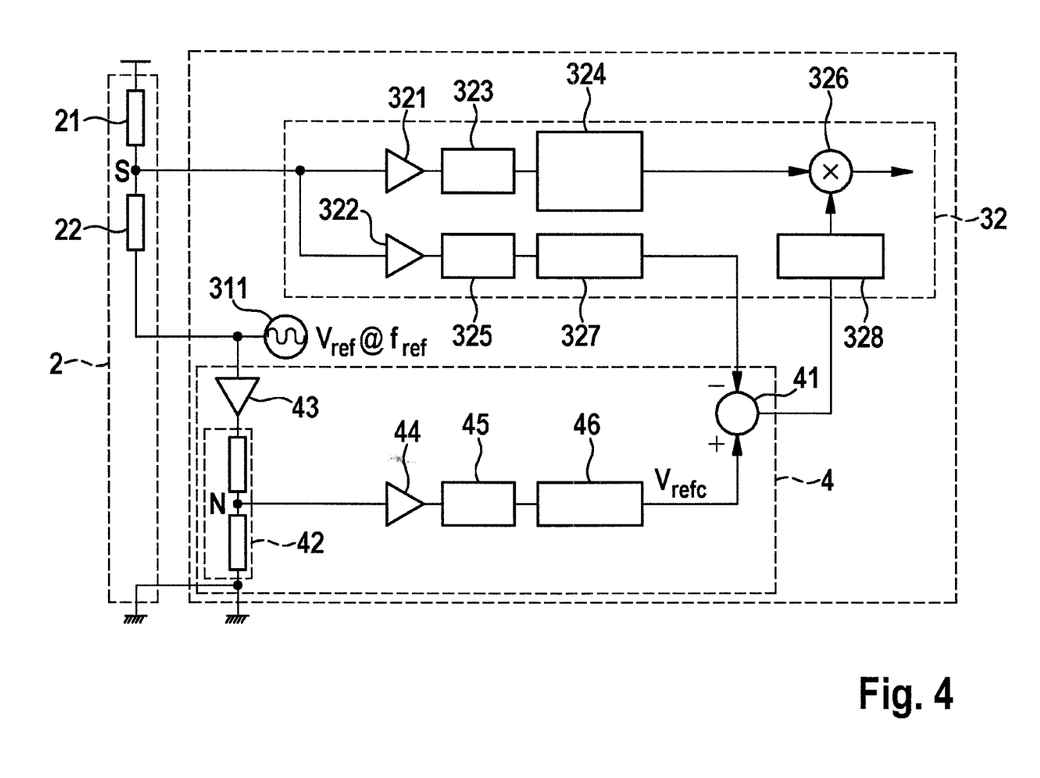
FIG. 4 schematically shows a more detailed implementation with a temperature compensation of the injection signal generator.

Another embodiment of the present invention is shown in FIG. 4. The embodiment of FIG. 4 shows an injection unit 31 with an injection signal source 311 for applying an injection voltage signal $V_{ref}f$. Furthermore, a compensation unit 4 to compensate the temperature is provided.

To compensate for temperature influences on the injection voltage signal $V_{ref}f$ (which causes the second sensing signal portion at the sensing node S), the output of the second filter unit 327 is supplied to one input of the subtraction unit 41. On another input of the subtraction unit 41, a compensation signal $V_{ref}f_C$ is applied. The compensation signal $V_{ref}fc$ is generated by means of a compensation voltage divider 42 having the same impedance ratio as the voltage divider 2. The impedances of the compensation voltage divider 42 are substantially lower than the impedance of the second dipole 22, so that the attenuation of the voltage divider 2 is not affected by the compensation voltage divider 42 in series with the second dipole 22. Particularly, the total impedance of the compensation voltage divider 42 may be less than ⅛, preferably less than 1/10, most preferably less than 5% of the impedance of the second dipole 22. In other embodiments, the compensation voltage divider 42 may not be in series with the voltage divider 2, so that the total impedance of the compensation voltage divider 42 may be independent from the impedance of the second dipole 22.

The injection signal source 311 (injection voltage source) is coupled via a buffer 43 to the compensation voltage divider 42, the intermediate node N of which is coupled to a third gain stage 44 which may be designed to be identical to the second gain stage 322. The output of the third gain stage 44 is coupled to a third AD converter 45, the output of which is coupled to a third digital filter unit 46. The third AD converter 45 and the third digital filter unit 46 may be designed identical to the second AD converter 325 and the second digital filter unit 327, respectively. The third digital filter unit 46 may have a selector for selectively extracting the signal portion at the frequency of the compensation signal $V_{ref}fc$. The output of the third digital filter unit 46 provides the compensation signal $V_{ref}fc$.

The temperature compensation unit 4 allows the generation of the compensation signal $V_{ref}f_C$ which has experienced the same attenuation as the injection signal injected into the voltage divider 2. Therefore, any temperature-related variations of the injection unit 31 can be eliminated by means of the subtraction unit 41. The output of the subtraction unit 41 is applied to the control logic 328 where the signal portion at the frequency of the compensation signal $V_{ref}f_C$ is associated to the correction value C as described above.

The frequency of the injection voltage signal $V_{ref}f$ needs to be selected to differ from the frequency of the AC high voltage. The injection voltage signal $V_{ref}f$ may be selected to be sinusoidal, but can have any other waveform as long as at least one harmonic of the injection signal has a known amplitude and all harmonics of the injection signal are different from the frequency of the high voltage to be measured. The sensing voltage with the overlaid injection signal can be isolated from the signal, either in the digital domain as described in the embodiments of FIG. 1 and FIG. 4, or in an analog domain through using analog filters, or by a combination of both. One main idea is to compare the response of the voltage divider 2 at the frequency of the injection voltage signal $V_{ref}f$ with a reference injection signal which might be temperature-compensated (see FIG. 4) or not (See FIG. 1). In the embodiment of FIG. 4, the reference injection signal is generated to be temperature-compensated.

Figure 5:
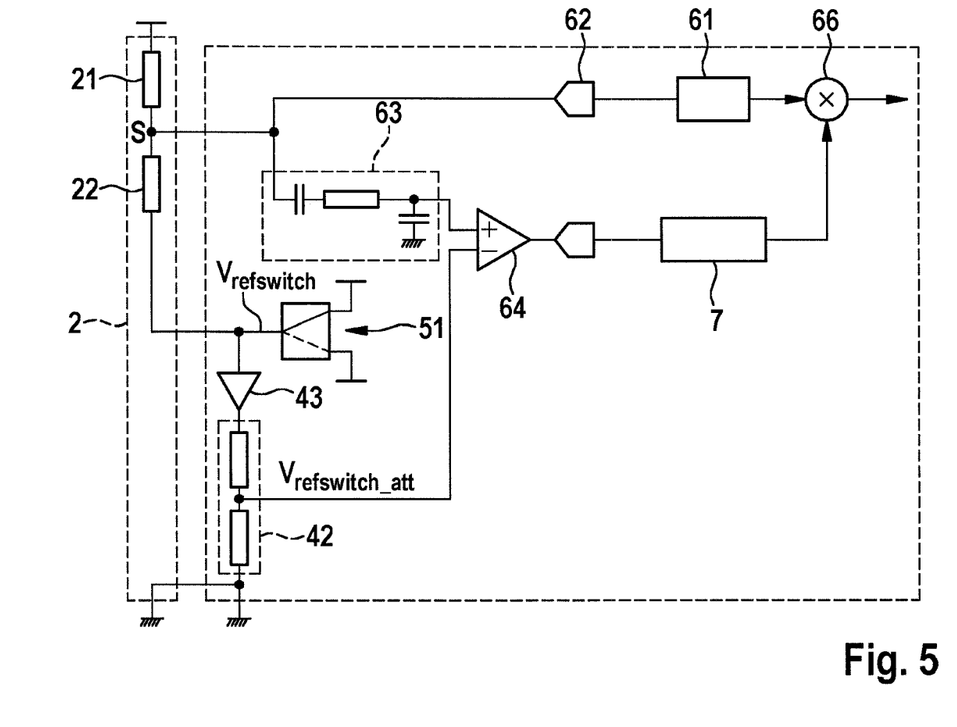
FIG. 5 schematically shows a further embodiment of the measurement system.

The embodiment of FIG. 5 differs from the embodiment of FIG. 4 with respect to the application of a switched injection signal $V_{ref}f_switch$ and using an analog filter to separate the switched injection signal $V_{ref}f_switch$ from the sensing signal to be measured.

The switched injection signal $V_{ref}f_switch$ is provided by a switched signal voltage source 51 which generates the switched injection signal $V_{ref}f_switch$ as a square waveform signal with a main frequency (switching frequency) lower than the frequency of the AC voltage to be measured at the high-voltage node HV. The switched injection signal $V_{ref}f_switch$ is coupled into the voltage divider 2 as described in the embodiments above.

To obtain the corrected sensing signal, a demodulation unit 61 is provided which allows for separating the sensing signal from the switched injection signal $V_{ref}f_switch$ by means of demodulation. The switched injection signal $V_{ref}f_switch$ is applied to the demodulation unit 61 to eliminate the effect of the switched injection signal $V_{ref}f_switch$ on the sensing signal. The demodulation unit 61 may be operated in an analog or a digital domain. In a digital domain, as it is shown in FIG. 5, an AD converter 62 is coupled upstream of the demodulation unit 61.

Furthermore, the sensing signal may be filtered by an analog filter 63 which may have low pass or band pass filter characteristics to let the (switching) frequency of the signal portion caused by the switched injection signal $V_{ref}f_switch$ pass through and to block the signal portion caused by the high voltage to be measured. The output of the analog filter 63 is supplied to a differential amplifier 64 on a non-inverting input thereof.

This embodiment also provides the compensation voltage divider 42 as described above. An attenuated switched injection signal $V_{ref}f_switch\_att$ is generated which has experienced attenuation in the compensation voltage divider 42 which has the same attenuation of the voltage divider 2 as described above. The attenuated switched injection signal $V_{ref}fswitch\_att$ is applied at the inverting input of the differential amplifier 64. The differential amplifier 64 outputs a difference signal between the attenuated switched injection signal $V_{ref}f_switch\_att$ and the filtered sensing signal. The difference signal has a square waveform whose amplitude is related to the drift due to variations of the impedances in the voltage divider 2. The difference signal can be applied to a logic unit 7 which associates a correction value C to the amplitude of the difference signal. The correction value C can be applied on the demodulated sensing signal by means of a multiplier 66 as described in the embodiments above, or alternatively, by any other operation unit, such as an adder.

Without drift, the attenuated switched injection signal $V_{ref}fswitch\_att$ corresponds to the mismatch between the compensation voltage divider 42 and the voltage divider 2. The compensation voltage divider 42 can be considered stable in time and temperature with respect to the drift of the voltage divider 2. The gain of the differential amplifier 64 may be chosen high, such as $G=10^4$ or more, and shall be implemented in a manner to render the tolerance and drift of the gain G several times smaller than the tolerance and drift of the impedances of the voltage divider 2.

The differential amplifier 64 receives the filtered sensing signal and the attenuated switched injection signal $V_{ref}f_switch\_att$ with almost the same amplitude. However, the difference corresponds to the mismatch of the compensation voltage divider 42 and the voltage divider 2. This allows for the gain to be very high in order to make it possible to read a very low level of signal changes induced by a variation of the voltage divider 2.

REFERENCE LIST

1 High-voltage measurement system
2 voltage divider
21 first dipole
22 second dipole
3 measuring unit
31 injection unit
311 injection voltage/signal source
312 current source
313 injection current source
314 transistor
315 transformer
32 correction unit
321 first gain stage
322 second gain stage
323 first AD converter
324 first digital filter unit
325 second AD converter
326 multiplier
327 second digital filter unit
328 control logic
4 temperature compensation unit
41 subtraction unit
42 compensation voltage divider
43 buffer
44 third gain stage
45 third AD converter
46 third digital filter unit
51 switched signal voltage source
61 demodulation unit
62 AD converter
63 analog filter
64 differential amplifier
66 multiplier
7 logic unit
C correction value
GND ground potential
HV high-voltage node
N intermediate node
S sensing node
Vref injection voltage signal
Vrefswitch switched injection signal
Vrefswitch_att attenuated switched injection signal

The invention claimed is:

1. A method for providing a corrected measuring signal indicating a high voltage on a high-voltage node, comprising the steps of:
   injecting a periodic injection signal into a voltage divider coupled between the high-voltage node and a reference potential;
   obtaining a sensing signal at a sensing node of the voltage divider, wherein the sensing signal depends on the periodic injection;
   from the sensing signal, separating a first sensing signal portion resulting from the high voltage and a second sensing signal portion resulting from the periodic injection signal; and
   depending on the second sensing signal portion, correcting the first sensing signal portion corresponding to the high-voltage signal in order to obtain the corrected measuring signal,
   wherein correcting the first sensing signal portion includes providing a correction signal, wherein the correction signal is applied on the first sensing signal portion,
   wherein the correction signal is obtained depending on the second sensing signal portion,
   wherein the periodic injection signal is provided by an injection signal source,
   wherein the correction signal is obtained depending on a difference signal between the injection signal exposed to an attenuation, which corresponds to an attenuation of the voltage divider, and the second sensing signal portion, and
   further comprising the step of injecting the periodic injection signal into a compensation voltage divider of a compensation unit, which compensation voltage divider is coupled between the injection signal source and the reference potential.

2. The method according to claim 1, further comprising the steps of: feeding a compensation signal provided by the compensation voltage divider of the compensation unit to an input of a subtraction unit or of a differential amplifier, and feeding the second sensing signal portion provided by the correction unit to another input of the subtraction unit or of the differential amplifier.

3. The method according to claim 1, wherein the injection signal is provided with a square waveform, wherein the difference signal has a square waveform the amplitude of which is associated to the correction signal.

4. The method according to claim 1, wherein the correction signal corresponds to a digital correction value to be applied on the first sensing signal portion.

5. The method according to claim 1, wherein correcting the first sensing signal portion includes associating the correction signal to the second sensing signal portion.

6. The method according to claim 1, wherein the injection signal is provided with a frequency which is different from the frequency of the high voltage, wherein separating the second sensing signal portion from the sensing signal is carried out by applying a digital or analog second filtering on the sensing signal.

7. The method according to claim 1, wherein separating the first sensing signal portion from the sensing signal is carried out by applying a digital or analog first filtering on the sensing signal.

8. The method according to claim 1, wherein the correction signal corresponds to a digital correction value to be applied on the first sensing signal portion.

9. The method according to claim 1, wherein correcting the first sensing signal portion includes associating the correction signal to the second sensing signal portion.

10. A measuring unit for providing a corrected measuring signal indicating a high voltage on a high-voltage node, comprising:
    an injection unit for injecting a periodic injection signal into a voltage divider coupled between the high-voltage node and a reference potential; and
    a correction unit which is configured
    to receive a sensing signal from a sensing node of the voltage divider;
    to separate a first sensing signal portion resulting from the high voltage and a second sensing signal portion resulting from the injection signal; and
    to correct the first sensing signal portion corresponding to the high-voltage signal in order to obtain the corrected measuring signal depending on the second sensing signal portion, a compensation unit configured to provide a compensation signal which is related to the periodic injection signal and which is for eliminating variations of the second sensing signal portion due to temperature variations, wherein the compensation unit comprises a compensation voltage divider, wherein the injection unit is configured to inject the periodic injection signal into the compensation voltage divider coupled between the injection unit and the reference potential, and wherein the injection unit comprises an injection source for supplying the periodic injection signal.

11. The measuring unit according to claim 10, wherein the injection unit includes a current mirror for injecting a reference signal into the voltage divider as an injection signal.

12. The measuring unit according to claim 11, wherein the correction unit includes a first filter unit and/or a second filter unit configured to separate the first sensing signal portion and the second sensing signal portion from the sensing signal at the sensing node.

13. The measuring unit according to claim 10, wherein the correction unit includes a first filter unit and/or a second filter unit configured to separate the first sensing signal portion and the second sensing signal portion from the sensing signal at the sensing node.

14. The measuring unit according to claim 10, wherein the compensation voltage divider has the same impedance ratio as the voltage divider.

15. The measuring unit according to claim 10, wherein the compensation signal provided by the compensation voltage divider of the compensation unit is supplied to an input of a subtraction unit or of a differential amplifier, and wherein the second sensing signal portion provided by the correction unit is supplied to another input of the subtraction unit or of the differential amplifier.

16. The measuring unit according to claim 15, wherein an output of the subtraction unit or of the differential amplifier is associated with a correction value and is fed to a multiplier and there multiplied with the first sensing signal portion to correct variations of the portion of the sensing signal.

17. A measurement system for providing a corrected measuring signal indicating a high voltage on a high-voltage node, comprising:

a voltage divider having a first dipole and a second dipole serially connected between the high-voltage node and a reference potential and providing an intermediate sensing node; and a measuring unit comprising an injection unit for injecting a periodic injection signal into the voltage divider coupled between the high-voltage node and the reference potential, and a correction unit which is configured to receive a sensing signal from a sensing node of the voltage divider, to separate a first sensing signal portion resulting from the high voltage and a second sensing signal portion resulting from the injection signal, and to correct the first sensing signal portion corresponding to the high-voltage signal in order to obtain the corrected measuring signal depending on the second sensing signal portion, a compensation unit configured to provide a compensation signal which is related to the periodic injection signal and which is for eliminating variations of the second sensing signal portion due to temperature variations, wherein the compensation unit comprises a compensation voltage divider, the injection unit being configured to inject the periodic injection signal into the compensation voltage divider coupled between the injection unit and the reference potential, and wherein the injection unit comprises an injection source for supplying the periodic injection signal.

* * * * *